United States Patent [19]
Winer

[11] Patent Number: 5,963,781
[45] Date of Patent: Oct. 5, 1999

[54] TECHNIQUE FOR DETERMINING SEMICONDUCTOR SUBSTRATE THICKNESS

[75] Inventor: Paul Winer, Santa Clara, Calif.

[73] Assignee: Intel Corporation, Santa Clara, Calif.

[21] Appl. No.: 08/941,799

[22] Filed: Sep. 30, 1997

[51] Int. Cl.$^6$ .............................. G01R 31/26; H01L 21/66

[52] U.S. Cl. .................................. 438/14; 438/15; 438/16; 438/17

[58] Field of Search ................................... 438/16, 17, 15, 438/14

[56] References Cited

U.S. PATENT DOCUMENTS 5,138,256  8/1992  Murphy et al. .

*Primary Examiner*—John F. Niebling
*Assistant Examiner*—Josetta I. Jones
*Attorney, Agent, or Firm*—Blakely, Sokoloff, Taylor & Zafman

[57] ABSTRACT

The invention relates to a method of measuring the thickness of a semiconductor substrate. First, a semiconductor substrate having a thickness and a photocurrent generating structure is provided. Next, the semiconductor substrate is exposed to a light source and a current generated by the light source is measured across the photocurrent generating structure. Finally, the thickness of the semiconductor substrate is determined by the current measurement.

14 Claims, 5 Drawing Sheets

TECHNIQUE FOR DETERMINING SEMICONDUCTOR SUBSTRATE THICKNESS

BACKGROUND OF THE INVENTION

1. Field of the Invention

The invention relates to the field of semiconductor device fabrication and testing and more particularly to a method of determining semiconductor substrate thickness.

2. Description of Related Art

Once a newly designed integrated circuit (IC) is formed on a semiconductor, e.g., silicon, substrate, the IC must be thoroughly tested to confirm that the circuit performs as intended. Any portion of the IC that does not function properly must be identified so that it can be fixed by modifying the design of the IC. This process of testing an IC to identify problems with its design is known as debugging. After debugging the IC and correcting any problems with its design, the fully functional IC designs are used to mass produce ICs in a manufacturing environment for consumer use.

During the debugging process, it is often necessary to probe certain electrical interconnect lines in order to obtain important electrical data from the IC, such as for example, voltage levels, timing information, current levels, and thermal information. A typical IC device contains multiple layers of metal interconnects. However, the metal interconnects in the first metal layer of an IC device generally carry the most valuable electrical data for debugging purposes. Metal interconnect lines in the first metal layer reside closest to the semiconductor substrate and are usually directly coupled to important components of the IC device such as transistors, resistors, and capacitors. It is the electrical data received, manipulated, and transmitted by these components that a designer generally is most interested in analyzing during the debugging process.

FIG. 1 illustrates a surface view of the top side of an IC device. Metal interconnect lines and components of IC device 11 are formed, for example, on an underlying silicon substrate. The side of the silicon substrate upon which the IC is formed shall herein be referred to as the top side of the silicon substrate. As illustrated in FIG. 1, bond pads 13 are located along the periphery of IC device 11. In the center of IC device 11 is the active region 12 containing a majority of high density active circuitry of IC device 11. It is within active region 12 that most probing takes place during the debugging process. While probing the interconnect lines in active region 12, it is necessary to externally supply the power voltage signals to bond pads 13 to activate the circuitry within the active region. These voltage signals are supplied to bond pad 13 through a package to which IC device 11 is fixed.

FIG. 2 illustrates a cross-section of IC device 11 after packaging. IC device 11 is fixed to package substrate 15 and individual bond wires 14 are used to electrically couple each bond pad 13 to a corresponding pad on substrate 15. Each corresponding pad on package substrate 15 is then individually coupled to an external pin 16. The packaged IC device of FIG. 2 may then be placed within a socket in order to electrically couple external pins 16 to drivers that supply the necessary voltage signals to activate IC device 11. As illustrated in FIG. 2, IC device 11 is mounted to package substrate 15 with its top side facing away from package substrate 15. In this manner, once IC device 11 is activated through package pin 16, the internal, active region 12 may be accessed and probed since neither bond pads 13, package substrate 15, nor bond wires 14 obscure access to this region of IC device 11.

There are several problems with the design of IC device 11 and its method of packaging as described in FIGS. 1 and 2. One problem stems from the fact that as the density and complexity of IC device 11 increases, so must the number of bond pads required to control the functions of IC device 11. However, there is only a finite number of bond pads 13 that can fit along the periphery of IC device 11. Another problem with IC device 11 is that the active circuitry within region 12 must be routed to the peripheral region of IC device 11 in order to be electrically coupled to bond pads 13. By routing these interconnect lines over this relatively long distance across IC device 11, the increased resistive, capacitive, and inductive effects of these lengthy interconnect lines result in speed reduction of IC device 11. In addition, the inductance of bond wires 14 will also severely limit the high frequency operation of IC devices in these packages.

Techniques have been employed to overcome these and other limitations of the design and packaging of IC device 11 as shown in FIGS. 1 and 2. FIG. 3 illustrates a top side view of IC device 20. As illustrated in FIG. 3, bond pads 21 are formed along the top of the entire IC device so that the bond pads now reside directly over the active circuitry of IC device 20. By forming bond pads in both the center and periphery of IC device 20, more bond pads can be placed across the surface of the device than can be placed only within the peripheral region. In addition, active circuitry that underlies bond pads 21 of IC device 20 can be directly coupled to its nearest bond pad using relatively short interconnect lines. This minimizes the resistive, capacitive, and inductive effects associated with routing interconnect lines over long distances, thus improving speed performance.

FIG. 4 is an illustration of a cross-section of IC device 20 after being mounted to a package substrate 22. In order to mount IC device 20 to package substrate 22, solder balls 24 are placed on each of bond pads 21 to electrically couple each bond pad 21 to its corresponding pad on package substrate 22. Each corresponding pad on package substrate 22 is, in turn, coupled to an external pin 23. IC device 20 is mounted to package substrate 22 with its top side facing towards the package substrate. In comparison to the method used to mount IC device 11 to its package substrate in FIG. 2, IC device 20 is "flipped." For this reason, the design of IC device 20 illustrated in FIG. 3 and its subsequent packaging method illustrated in FIG. 4 is referred to as "flip-chip" technology. This technology is also referred to as Controlled Collapse Chip Connection (C4), named after the package mounting technique of using solder to replace bond wires.

As can be seen in FIGS. 3 and 4, the top of IC device 20 is obscured by bond pads 21, solder balls 24, and package substrate 22. Such is the case for IC devices packaged using C4 technology. Therefore, it is impossible to probe the circuitry of IC device 20 in the conventional manner described above since the circuitry of IC device 20 cannot be accessed from its top side.

Alternative techniques have been employed to permit access to interconnect lines on top of IC device 20 so that these lines may be probed. One technique involves redesigning the C4 IC device so that it can be packaged in a conventional wire bond package. The redesigned wire bond packaged IC device is then probed from the top of the silicon substrate in a more conventional manner. Unfortunately, the C4 IC device redesigned for wire bond packaging functions differently in a wire bond package than it would in its intended C4 package. As a result, the debugging process is hindered by the fact that electrical data collected during probing of the redesigned C4 IC device may not accurately reflect actual performance of the device when packaged in its native C4 package environment.

Another effort to access the interconnect lines on top of IC device 20 in its fully packaged environment is through the substrate back side. This is accomplished by milling the substrate down at diffusion probe points to a thickness that does not disturb devices formed in the substrate. Currently, the only means for determining when to stop the milling process is by characterizing the milling or etch rate versus time and then timing the etch. Various parameters may effect the milling process resulting in a milling that is either too deep or too shallow.

A method is needed to accurately measure and mill a semiconductor substrate to a predetermined thickness that is not adversely affected by various parameters that may affect the milling process. This would allow, for example, electrical data to be collected from an IC device which reflects the performance of the device as it was intended to operate in the fully packaged C4 product.

SUMMARY OF THE INVENTION

A method of measuring the thickness of a semiconductor substrate is disclosed. First, a semiconductor substrate having a thickness and a photo-generating structure is provided. Next, the semiconductor substrate is exposed to a light source. A current generated by the light source is measured across the photo-generating structure and the thickness of the semiconductor substrate is determined by the current measurement.

Additional features and benefits of the invention will become apparent from the detailed description, figures, and claims set forth below.

DETAILED DESCRIPTION OF THE INVENTION

A method of measuring the thickness of a semiconductor substrate is described. The method is presented in the context of a method of probing a C4 packaged integrated circuit device, because that is an area where an accurate measurement of the semiconductor substrate is particularly useful. It is to be appreciated, however, that there are many other areas where accurate measurement of the thickness of a semiconductor substrate is also useful. Thus, while the embodiment described with respect to a method of probing a C4 packaged IC is described, this description and the illustrations accompanying the description are not intended to limit the invention. The specific processes described herein are only meant to help clarify an understanding of the invention and to illustrate an embodiment of how the invention may be implemented in order to achieve a desired result.

Further, in the following description, numerous specific details, such as etch depth, process sequences, material compositions, etc. are set forth in order to provide a more thorough understanding of the invention. It is to be appreciated by one skilled in the art that the invention may be practiced without employing these specific details. In other instances, well known processes and processing techniques and equipment have not been described in detail in order to avoid unnecessarily obscuring the invention.

Figure 1:
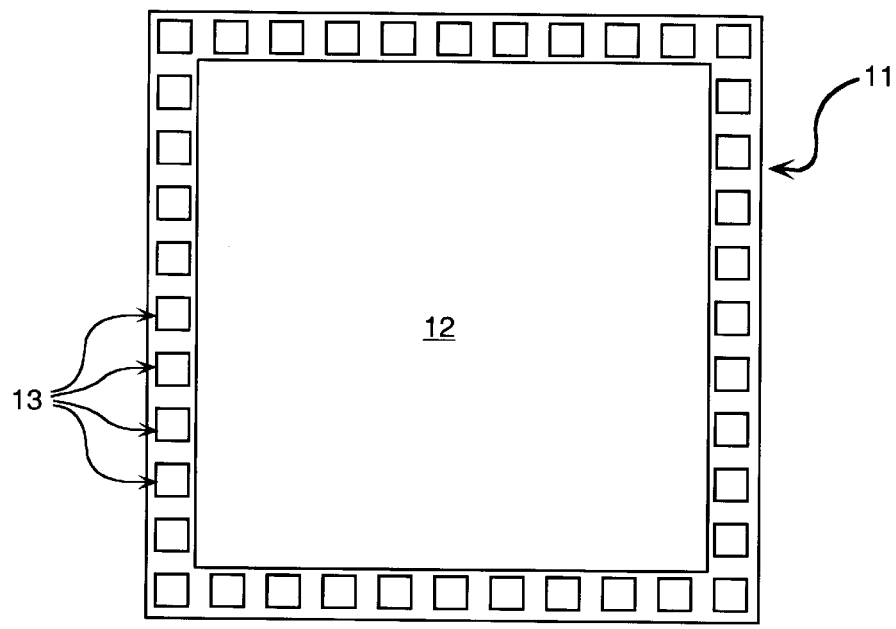
FIG. 1 is a top-view illustration of an IC device intended for wire bond packaging.
Figure 2:
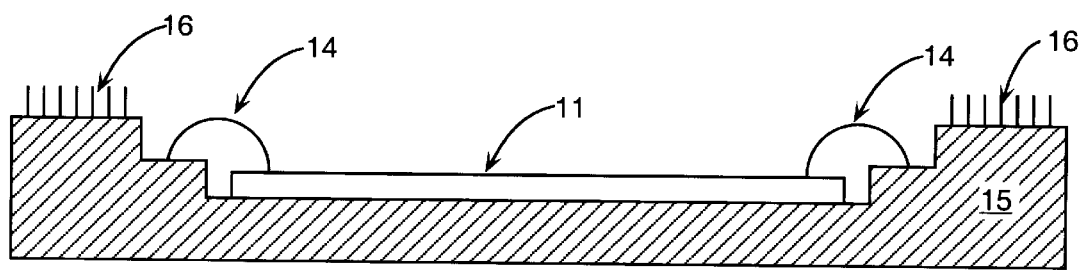
FIG. 2 is a cross-section of the IC device of FIG. 1 after the device has been packaged.
Figure 3:
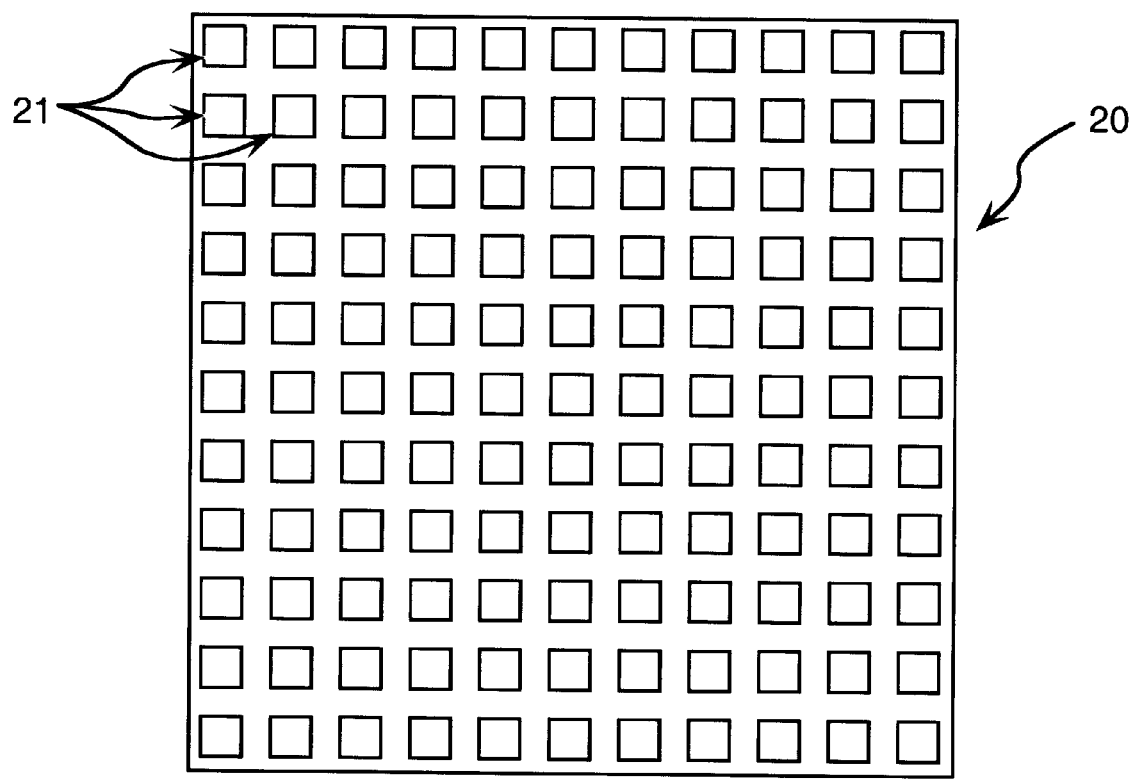
FIG. 3 is a top view illustration of an IC device intended for C4 packaging.
Figure 4:
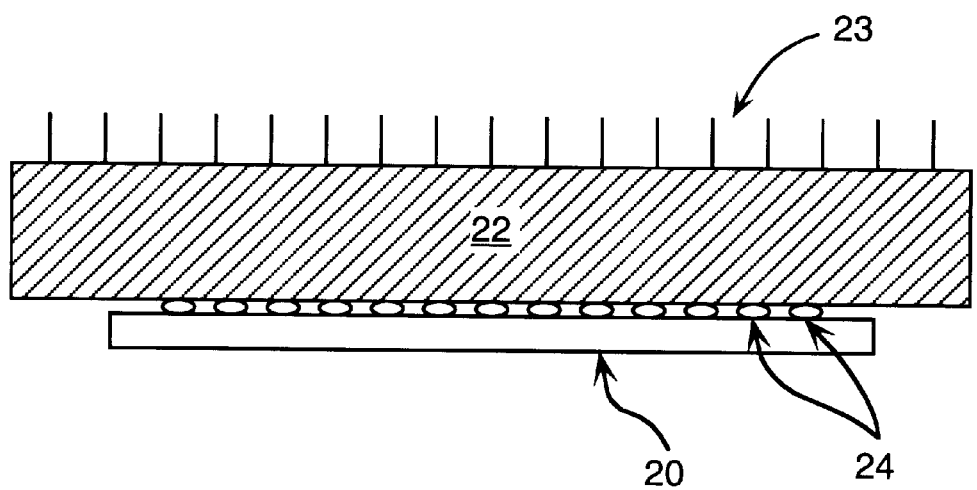
FIG. 4 is a side view of the IC device of FIG. 3 after the device has been packaged.
Figure 5:
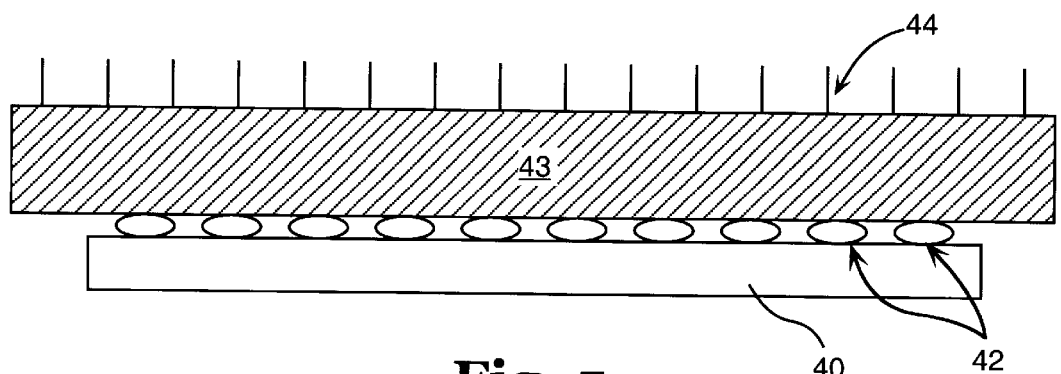
FIG. 5 is an illustration of a cross-sectional view of an IC device intended for C4 packaging in accordance with an embodiment of the invention.

FIG. 5 is a cross-section of a C4 packaged chip, similar to the C4 packaged chip described above in conjunction with FIGS. 3 and 4. Chip 40 has an integrated circuit formed on its top side, above which, bond pads have been created. Each of these bond pads on top of chip 40 are electrically coupled to a corresponding pad on package substrate 43 through a solder ball 42. Each corresponding pad on package substrate 43 is, in turn, coupled to an external pin 44. These pins may be inserted into an appropriate socket for operation of the IC device.

The thickness of chip 40 is in the range of approximately 400–700 microns, but it is only the upper 10 to 15 microns of chip 40 in which active circuitry resides. It is this active circuitry which is to be probed in accordance with the method of probing a C4 packaged IC. The remainder of chip 40 primarily comprises an inactive silicon substrate. To shorten the amount of time it takes to etch holes through the bottom of this underlying, thick silicon substrate (as described in greater detail below), the first step is to globally thin chip 40 by mechanical polishing.

Figure 6:
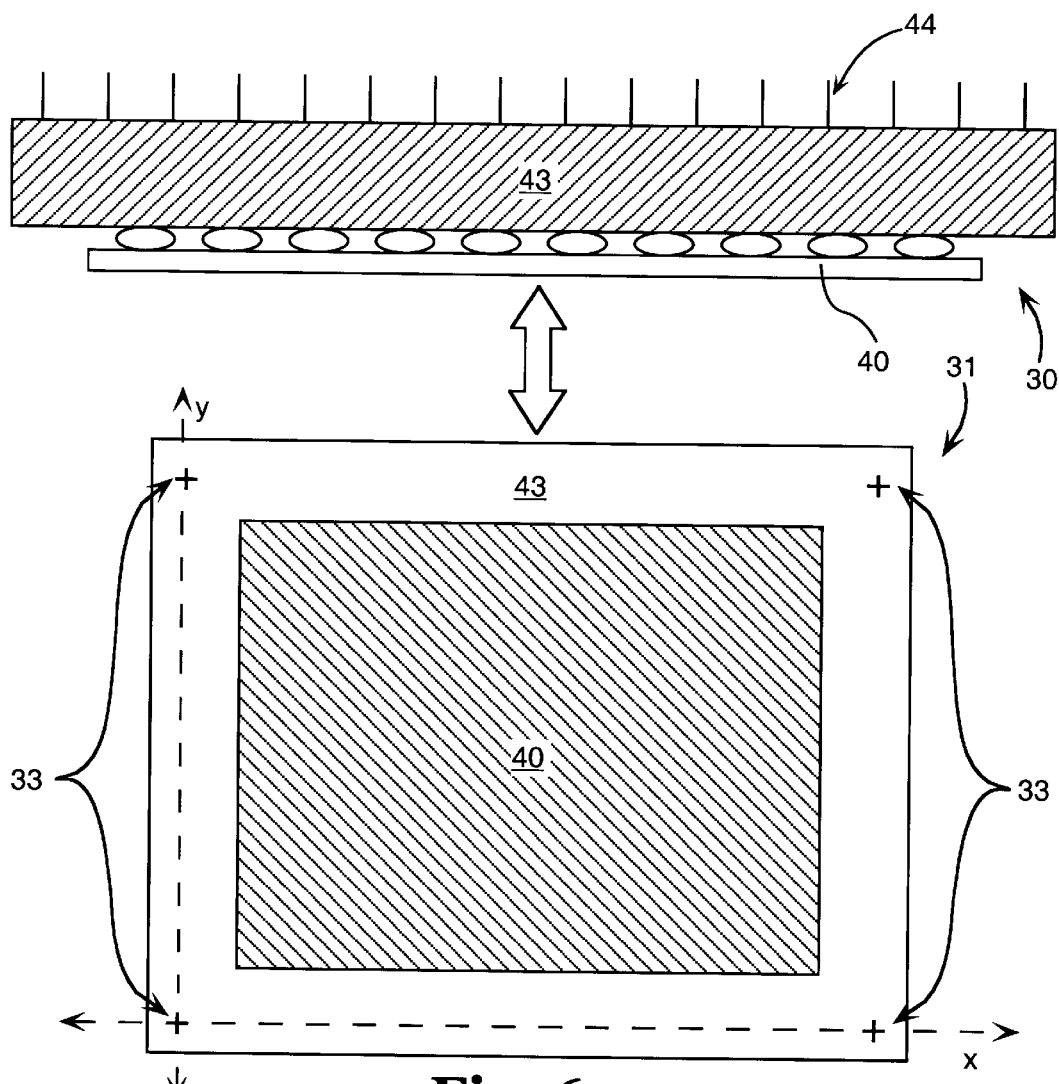
FIG. 6 is a top cross-sectional and surface view of the C4 packaged IC device of FIG. 5 after a bottom portion of the silicon substrate of the IC device has been globally thinned.

In this first step, the majority of the silicon substrate of chip 40 is removed from the bottom of the chip by the mechanical polishing process. FIG. 6 shows the cross-section 30 of FIG. 5 after chip 40 has been globally thinned to a thickness within the range of approximately 50–150 microns. In this embodiment, the silicon substrate of chip 40 is polished back to be as thin as possible without breaking or otherwise significantly impacting the performance of the circuitry on top of the chip.

FIG. 6 shows a surface view 31 of the bottom of the C4 packaged chip 40 having cross sectional view 30. To ensure proper electrical coupling between package pins 44 and the circuitry of chip 40, the bond pads on top of chip 40 are aligned to the corresponding pads on package substrate 43 so that the solder balls 42 can properly couple the two together. This is accomplished by aligning chip 40 to package fiducials 33 and to the x-y coordinate system established by these package fiducials. Package fiducials 33 are alignment marks that are formed on package substrate 43 and are aligned to the pads on package substrate 43.

The next step in accordance with the method of probing a C4 packaged IC device is to use the x-y coordinate system established by package fiducials 33 of FIG. 6 in the manner described above to determine the approximate location of features on chip 40 known as chip fiducials. Chip fiducials are alignment marks designed into the first metal layer (M1) of the chip and are placed, for example, in at least three corners of the chip. Chip fiducials are used in a manner similar to package fiducials 33, but since chip fiducials are located within the circuitry on top of chip 40, they are self-aligned to the circuitry on chip 40 thereby allowing more precise navigation from the bottom of the chip.

Figure 7:
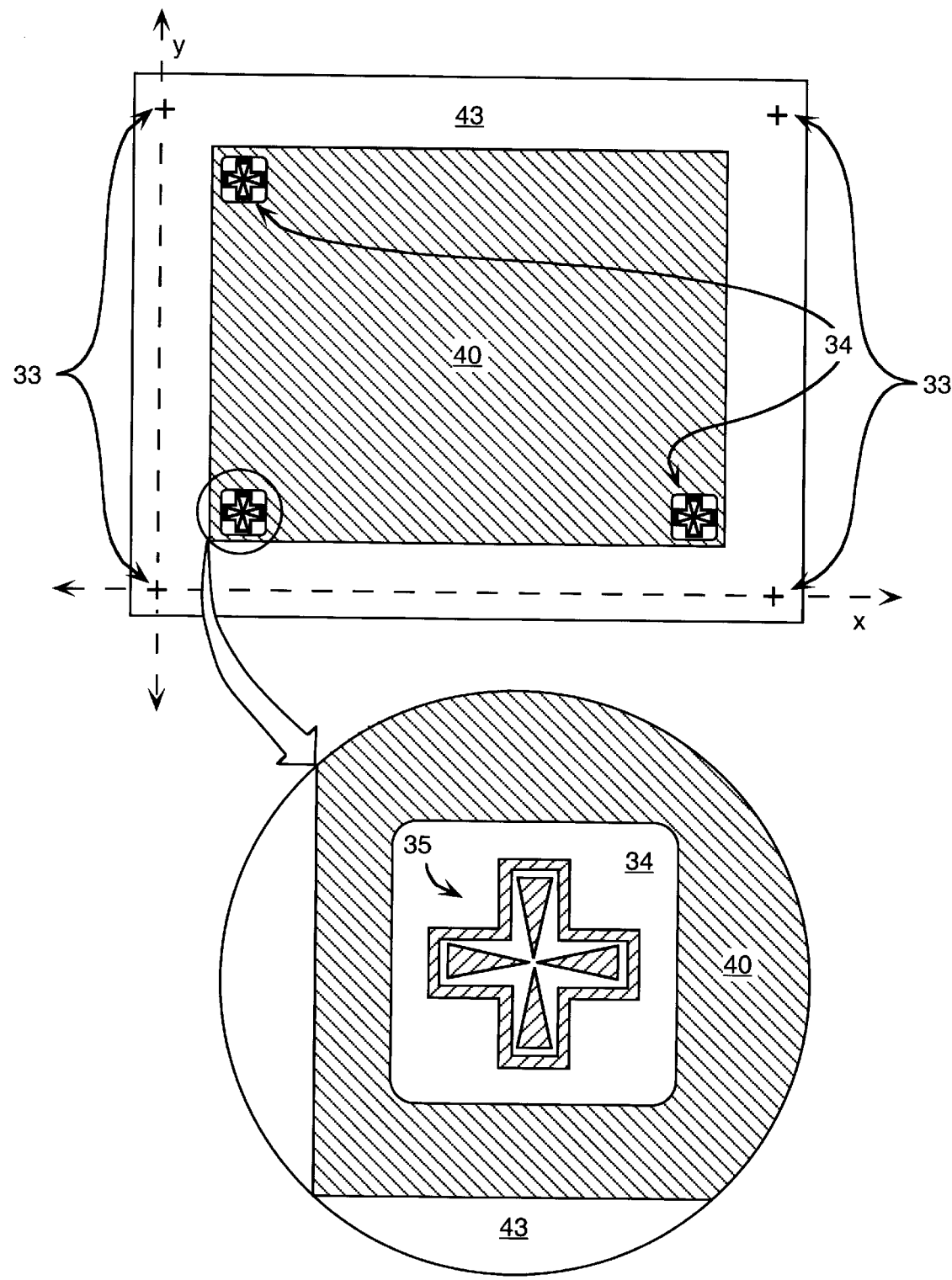
FIG. 7 is a surface view of the C4 packaged IC device of FIG. 6 after alignment holes have been etched to expose three fiducials.

Using the x-y coordinate system established by package fiducials 33 of FIG. 6, the approximate locations on the bottom of chip 40 residing directly below the three Ml chip fiducials on top of chip 40 are determined. Once determined, alignment holes are etched through the bottom of chip 40 at these locations to expose the three M1 chip fiducials on top of the chip. FIG. 7 illustrates the C4 packaged chip of FIG. 6 after the underlying silicon substrate has been etched, and the three M1 chip fiducials 35 have been exposed in accordance with the invention.

Once three alignment holes 34 have been etched to expose M1 chip fiducials 35 through the bottom of chip 40, as illustrated in FIG. 7, M1 chip fiducials 35 are used to enable virtual navigation through the circuitry of chip 40 from the bottom of the chip. The C4 packaged chip of FIG. 7 is affixed to a high precision, computer controlled positioning stage. Then, using chip fiducials 35 for alignment, a computer-based circuit diagram of chip 40 is electronically merged with the stage position of chip 40 on the computer's display screen. As a result, one can accurately determine the location of any point on the bottom of chip 40 residing directly below its corresponding point in the circuitry on top of chip 40 by referencing the computer-based circuit diagram displayed on the computer screen.

Figure 8:
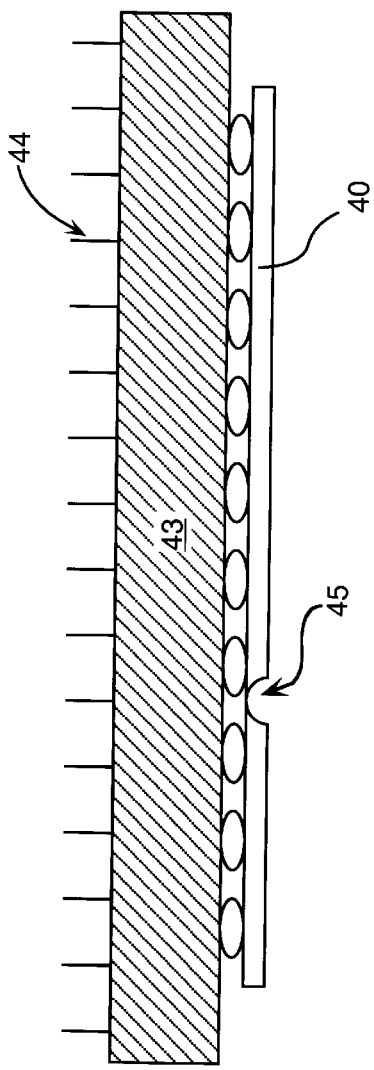
FIG. 8 is a cross-sectional side view of the C4 packaged IC device of FIG. 7 after a bottom portion of the silicon substrate of the IC device has been locally thinned using a photocurrent measurement.

Using the virtual navigation method described above, the point on the bottom of chip 40 that resides directly below the probe point in the Ml layer on top of chip 40 is located. Once located, this region is locally thinned using, for example, a gas-assisted laser etching system. Local thinning is a process by which the majority of the remaining silicon substrate is removed in the local region underneath the probe point. FIG. 8 illustrates a cross-sectional view of the C4 packaged chip of FIG. 8 after region 45 has been locally thinned.

The size of locally thinned region 45 depends on the size and location of the probe point within the circuitry on top of chip 40. In accordance with the invention, to probe an M1 interconnect line approximately 1 micron wide, locally thinned region 45 is in the range of approximately 100 by 100 microns to 300 by 300 microns centered about the location directly beneath the probe point. However, because multiple probe points may be accessed by etching multiple probe holes through the locally thinned region, one may wish to thin a larger region to gain access to multiple probe points which may be a large distance apart from each other.

Figure 9:
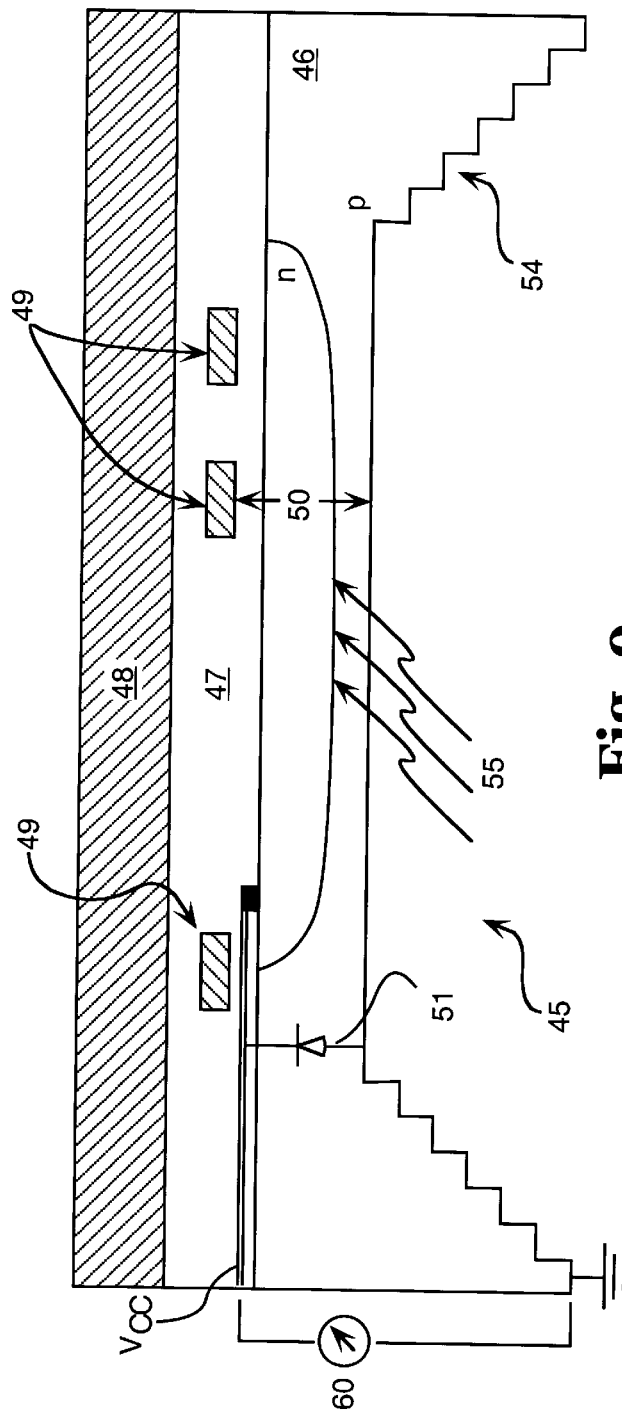
FIG. 9 is a cross-sectional side view of the IC device of FIG. 8 magnified to illustrate that portion of the device within the locally thinned region.

FIG. 9 illustrates an enlarged view of locally thinned region 45 of the C4 packaged chip of FIG. 8. The graded, stair-step profile, 54, formed by the gas-assisted laser etching method is illustrated where each step represents a layer of progressively smaller sections of substrate 40 which have been etched from the region. In general, the size, shape, and sidewall profile of the locally thinned region should be selected to minimally interfere with device performance, accommodate subsequent probe hole formation, and permit probing of the circuitry.

Cross-sections of three M1 interconnect lines 49 are illustrated in the enlarged view of locally thinned region 45 in FIG. 9. These three interconnect lines 49 represent the probe points to be probed in accordance with the probing method described. It is to be appreciated that there can be multiple layers of interconnect lines, but such lines are not shown for clarity reasons. Layer 47 comprises an electrically insulating silicon dioxide material used to isolate M1 interconnect lines 49 from each other, from the underlying silicon substrate 46, and from the rest of the circuitry of chip 40. The remaining layers of the integrated circuit, including additional metal interconnect and dielectric layers, reside in region 48.

Prior to locally thinning silicon substrate 46, silicon substrate 46 is approximately 200 microns thick after the polish. To probe M1 interconnect tracks 49, probe holes must be etched through silicon substrate 46 and interlayer dielectric 47. In the embodiment described, it is necessary to etch region 45 to within approximately 3 to 25 microns, illustrated as depth 50, below the desired probe point in the M1 layer of chip 40. This etch must be cognizant of the durability of the chip as well as many devices formed in substrate 46 that cannot be affected or damaged when exposing a probe point.

The method in accordance with an embodiment of the invention takes advantage of the fact that there is an abundance of n-wells built into an integrated circuit formed in a p-silicon substrate. For example, complementary metal oxide semiconductor (CMOS) devices are constructed with adjacent n- and p-type diffusion regions. Each of the p-n junctions creates a diode that generally allows electricity to go in only one direction. Further, each n-well is generally coupled to a voltage ($V_{CC}$) to inhibit the flow of electricity between the n-well and the substrate. This is known as a "reversed biased" state.

Photons entering a p-n junction create a photocurrent thereby turning light into electricity. Thus, for certain thicknesses of silicon or other semiconductor substrate, a monitor 60 between $V_{CC}$ and ground will detect a photocurrent generated by a p-n junction, illustrated schematically in FIG. 9 by a diode labeled reference numeral 49.

Ordinarily, when light in the visible range is directed at the backside of silicon substrate 46 having a thickness of between 400–700 microns, the light will be absorbed before it can travel to the p-n junction of substrate 46. As silicon substrate 46 gets thinner, more light can travel through substrate 46 and reach the p-n junction. The light that gets through will generate a photocurrent. The photocurrent is proportional to the thickness of silicon substrate 46. Thus, by monitoring the current between $V_{CC}$ and ground, the thickness of substrate 46 is accurately measured, with at least ±1 micron accuracy. Accordingly, a laser chemical etching of locally thinned region 45 can be taken to a thickness in the range of approximately 3 to 25 microns, and in one embodiment down to 10 microns. This 10 micron thickness is thick enough so as not to damage any devices formed in silicon substrate 46.

The embodiment described uses a gas-assisted laser etching system. In one embodiment, the gas-assisted laser etching system includes its own light source, indicated in FIG. 9 as light rays 55. It is to be appreciated that other forms of etching or milling may be used to obtain the proper depth of thinned region 45, such as patterning and chemically etching the region, FIB etching, or any combinations of techniques.

A light source is needed to produce the photocurrent. It is to be appreciated that any light source (electromagnetic radiation source) is acceptable, so long as the light source is capable of generating a photocurrent at a photocurrent generating structure, such as a p-n junction, of a semiconductor substrate, particularly in regions below 45 microns for a silicon substrate. Other light sources include, but are not limited to, continuous light beams, strobed light beams, and polychromatic or monochromatic light sources. In general, the light source will have a wavelength corresponding to an energy below the band gap of the semiconductor substrate.

In the embodiment described, locally thinned area 45 was milled to a substrate thickness of 10±1 microns for a current generation silicon wafer such as utilized by the assignee for an integrated circuit and generated a 600 μA signal with a 2.4 watt multi-line, argon ion, focused laser beam laser hitting the surface of the wafer at that thickness.

In the example described, a current amplifier was used. Other ways of measuring the photocurrent presented to the diode include measuring the voltage drop with or without an added resistance to the device, lock-in amplifiers, and boxcar averagers. Additional equipment may include one or more of a current meter, voltage meter, lock-in amplifier, power supply (constant voltage source or constant current source), word generator (or other device to bias the device to a known internal state), and light modulator (EOM, AOM, scanning mirrors, other mechanical devices).

The advantage of the invention to the C4 probing process is that it enables the evaluation of the depth of thinned region 45 relative to devices (e.g., transistors, etc.) in substrate 46 without adding significantly to the existing laser-etching equipment. The invention works particularly well for stopping the etch very close to the devices in substrate 40. Absent the reliance on a photocurrent measurement, there is no reliable direct way of in situ measuring of the remaining thickness of locally thinned region 45.

Once an area is locally thinned, probe holes are etched, such as for example with an FIB etching system, through silicon substrate 46 and through a portion of silicon dioxide layer 47 to allow electron-beam ("e-beam") probing of interconnect tracks 49 from the bottom of chip 40 to obtain electrical data. In one example, the portions of interconnect tracks 49 to be probed reside over isolation regions or other inactive regions of the integrated circuit.

The accurate measurement of a semiconductor substrate by measuring the current generated by a photocurrent across a photocurrent generating structure, such as a p-n junction of a substrate device has been demonstrated with respect to a method of probing a C4 packaged IC. It is to be appreciated that the method of measurement is not limited to such a probing technique. The method described by the invention can be used wherever the thickness of a thin semiconductor substrate is accurately needed. The invention can be used, for example, in process techniques where the measurement of thin silicon or other semiconductor substrates (e.g., GaAs) are needed or in microsurgery to repair damaged integrated circuits. It is to be appreciated, however, that the invention is not to be limited to microprocessors or integrated circuits. As noted, the invention may be used to measure any semiconductor substrate having a photocurrent generating structure, such as for example, a p-n or p-i-n junction.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method of measuring a thickness of a semiconductor substrate having a photocurrent generating structure, comprising:
   exposing the semiconductor substrate to a light source;
   measuring a current generated by the light source across the photocurrent generating structure to determine a current measurement; and
   determining the thickness of the semiconductor substrate using the current measurement.

2. The method of claim 1, wherein the photocurrent generating structure is a p-n junction.

3. The method of claim 2, wherein the semiconductor substrate is a silicon substrate.

4. The method of claim 3, wherein the silicon has a band gap, and wherein the light source has a wavelength corresponding to an energy below said band gap of the silicon substrate.

5. The method of claim 1, wherein the light source is one of a filtered light source, a laser light source, a polychromatic light source, and a monochromatic light source.

6. A method of reducing the thickness of a semiconductor substrate, comprising:
   exposing a semiconductor substrate having a first thickness and a photocurrent generating structure to a light source;
   measuring a first current generated by the light source across the photocurrent generating structure, the first current corresponding to the first thickness; and
   reducing the thickness of the semiconductor substrate to a second thickness, wherein the second thickness is determined by measuring a second current generated by the light source across the photocurrent generating structure.

7. The method of claim 6, wherein the photocurrent generating structure is a p-n junction.

8. The method of claim 7, wherein the semiconductor substrate is a silicon substrate.

9. The method of claim 8, wherein the silicon has a band gap, and wherein the light source has a wavelength corresponding to an energy below the band gap of the silicon substrate.

10. The method of claim 7, wherein the light source is one of a filtered light source, a laser light source, a polychromatic light source, and a monochromatic light source.

11. The method of claim 6, wherein the step of reducing the thickness of the semiconductor substrate comprises an etching step.

12. A method of testing an integrated circuit having a photocurrent generating structure and devices formed on a first side of a semiconductor substrate, the method comprising:
   reducing a thickness of the semiconductor substrate from a second side of the semiconductor substrate at a point aligned with a device to be tested, wherein a reduction in thickness of the semiconductor substrate is measured by a current measurement derived by exposing the semiconductor substrate to a light source and measuring a current;
   exposing the device to be tested; and
   testing the device.

13. The method of claim 1, wherein the device to be tested is an interconnection.

14. The method of claim 1, wherein the integrated circuit is a controlled collapse chip connection integrated circuit chip.

\* \* \* \* \*

UNITED STATES PATENT AND TRADEMARK OFFICE
CERTIFICATE OF CORRECTION

PATENT NO.    : 5,963,781
DATED         : October 5, 1999
INVENTOR(S)   : Winer

It is certified that error appears in the above-identified patent and that said Letters Patent is hereby corrected as shown below:

<u>Column 6,</u>
Line 38, delete "49", insert -- 51 --.

<u>Column 8,</u>
Line 17, delete "said", insert -- the --.
Lines 61 and 63, delete "claim 1", insert -- claim 12 --.

Signed and Sealed this

Twenty-fourth Day of June, 2003

JAMES E. ROGAN
*Director of the United States Patent and Trademark Office*